(12) United States Patent
Ishikawa

(10) Patent No.: US 8,234,608 B2
(45) Date of Patent: Jul. 31, 2012

(54) CIRCUIT SPECIFICATION DESCRIPTION VISUALIZING DEVICE, CIRCUIT SPECIFICATION DESCRIPTION VISUALIZING METHOD AND STORAGE MEDIUM

(75) Inventor: Takashi Ishikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 12/578,659

(22) Filed: Oct. 14, 2009

(65) Prior Publication Data
US 2010/0218147 A1    Aug. 26, 2010

(30) Foreign Application Priority Data

Feb. 25, 2009    (JP) .................................. 2009-042877

(51) Int. Cl.
*G06F 17/50*    (2006.01)
*G06F 9/455*    (2006.01)
(52) U.S. Cl. .......................... 716/104; 716/106; 716/113
(58) Field of Classification Search .................. 716/104, 716/106, 12, 113, 115, 123, 126, 136
See application file for complete search history.

(56) References Cited

U.S. PATENT DOCUMENTS

| | | | | |
|---|---|---|---|---|
| 6,163,763 | A | * | 12/2000 | Cox et al. .......................... 703/17 |
| 2008/0114870 | A1 | * | 5/2008 | Pu .................................. 709/224 |
| 2009/0064059 | A1 | * | 3/2009 | Tsuchiya .......................... 716/1 |

FOREIGN PATENT DOCUMENTS

JP    05-101132    4/1993
* cited by examiner

*Primary Examiner* — Vuthe Siek
*Assistant Examiner* — Mohammed Alam
(74) *Attorney, Agent, or Firm* — Turocy & Watson, LLP

(57) ABSTRACT

A design analyzing device includes a circuit specification description analyzing section configured to create structure data about an assertion description, a pass pattern creating section configured to create data about a plurality of pass patterns for which the assertion description passes from the structure data, a matching waveform calculating section configured to create waveform data for each signal in a circuit defined by the assertion description and correlation data that indicates a correlation between the waveform of each signal and a partial expression in the assertion description based on data of each of the plurality of pass patterns, and a display data outputting section configured to output display data about a diagram showing the correlation between each partial expression and the waveform of each signal for each pass pattern.

20 Claims, 14 Drawing Sheets

GENERAL DESCRIPTION:
THE FUNCTION $rose IS USED IN THE FORM OF "$rose(E1)" AND PASSES ONLY IF THE VALUE OF THE EXPRESSION E1, THE OPERAND, IS 0 IN THE CYCLE IMMEDIATELY PRECEDING THE EVALUATION START CYCLE AND THE VALUE OF THE EXPRESSION E1 IS 1 IN THE EVALUATION START CYCLE DESCRIPTION BY EXAMPLE:
FOR EXAMPLE, IN THE CASE OF THE PART YOU SELECTED, EVALUATION OF THE FUNCTION $rose STARTS FROM THE CYCLE "T3", AND THE FUNCTION $rose PASSES IN THE CYCLE. THIS IS BECAUSE THE VALUE "b", THE OPERAND, IS 0 IN THE CYCLE "T2" AND 1 IN THE CYCLE "T3".

GENERAL DESCRIPTION:
THE FUNCTION $rose IS USED IN THE FORM OF "$rose(E1)" AND PASSES ONLY IF THE VALUE OF THE EXPRESSION E1, THE OPERAND, IS 0 IN THE CYCLE IMMEDIATELY PRECEDING THE EVALUATION START CYCLE AND THE VALUE OF THE EXPRESSION E1 IS 1 IN THE EVALUATION START CYCLE DESCRIPTION BY EXAMPLE:
FOR EXAMPLE, IN THE CASE OF THE PART YOU SELECTED, EVALUATION OF THE FUNCTION $rose STARTS FROM THE CYCLE "★3", AND THE FUNCTION $rose PASSES IN THE CYCLE. THIS IS BECAUSE THE VALUE "★1", THE OPERAND, IS 0 IN THE CYCLE "★2" AND 1 IN THE CYCLE "★3".

CIRCUIT SPECIFICATION DESCRIPTION VISUALIZING DEVICE, CIRCUIT SPECIFICATION DESCRIPTION VISUALIZING METHOD AND STORAGE MEDIUM

CROSS-REFERENCE TO RELATED APPLICATION

This application is based upon and claims the benefit of priority from the prior Japanese Patent Application No. 2009-042877 filed in Japan on Feb. 25, 2009, the entire contents of which are incorporated herein by reference.

BACKGROUND OF THE INVENTION

1. Field of the Invention

The present invention relates to a circuit specification description visualizing device, a circuit specification description visualizing method and a storage medium. In particular, it relates to a circuit specification description visualizing device, a circuit specification description visualizing method and a storage medium configured to design a semiconductor integrated circuit using a circuit specification description.

2. Description of Related Art

According to prior art, a semiconductor integrated circuit is designed based on a circuit specification described using a natural language or a property description language.

However, when the circuit specification is described using a natural language, polysemy or ambiguity of the natural language can cause disagreement in interpretation among the designers, which can lead to an inoperative circuit or other problems. Using a property description language (such as SVA and PSL) to describe the circuit specification can help solve the problem of the polysemy or ambiguity of the description. However, it is only a partial and inadequate solution.

For example, a circuit specification that "if req is asserted, ack is asserted" written in a natural language cannot be converted into a property description language if the polarity of the signals and the number of req/ack cycles are ambiguous. Therefore, typically, the ambiguity is eliminated before the natural language is converted into the property description language.

However, even if the circuit specification is described in the property description language, the polysemy or ambiguity of the circuit specification description cannot necessarily be eliminated enough. For example, when a circuit specification that "if req is asserted, ack is asserted" described in the natural language is converted into a circuit specification that "req|=>ack" described in SVA, which is a property description language, it remains obscure whether req is 1 or 0 in a cycle following a cycle in which req is 0 or whether ack is 1 or 0 in a cycle preceding a cycle in which ack is 1. In the natural language, the circuit specification "req|=>ack" means that when req is 1 in a cycle, ack is 1 in the immediately following cycle. Furthermore, the status of req in a cycle preceding a cycle in which req is 1, that is, whether req is 1 or 0 in a cycle preceding a cycle in which req is 1, also remains obscure.

In other words, even the circuit specification described in the property language described above can have a plurality of signal patterns, or in other words, pass patterns for one circuit specification description. However, the designer does not have means to recognize the level of ambiguity of the circuit specification description written by the designer themselves.

As a result, in many cases, the intention of the designer is not correctly interpreted, and the failures described above occur.

For example, as disclosed in Japanese Patent Application Laid-Open Publication No. 5-101132, a logic circuit operation testing device is proposed, which is configured to smoothly and efficiently test a circuit to be designed. However, the patent literature does not disclose any method of allowing a designer to recognize the level of ambiguity of a circuit specification description written by the designer themselves.

In addition, it is also hard to recognize a correlation between each partial expression in the circuit specification and a part of a signal waveform. Therefore, the designer cannot easily understand the meaning of an assertion and modify the assertion.

BRIEF SUMMARY OF THE INVENTION

According to an aspect of the present invention, there is provided a circuit specification description visualizing device, including: a circuit specification description analyzing section configured to analyze a syntax of a circuit specification description to create structure data about a partial expression included in the circuit specification description; a pass pattern creating section configured to create data about a plurality of pass patterns for which the circuit specification description passes from the structure data created by the circuit specification description analyzing section; a waveform data creating section configured to create waveform data about a waveform of at least one signal in a circuit defined by the circuit specification description based on data about each of the plurality of pass patterns created by the pass pattern creating section; a correlation data creating section configured to create correlation data that indicates a correlation between the waveform of the at least one signal and the partial expression included in the circuit specification description based on the data about each of the plurality of pass patterns; and a display data outputting section configured to output display data about a diagram showing the correlation between the partial expression included in the circuit specification description and the waveform of the at least one signal for each of the plurality of pass patterns based on the structure data, the waveform data and the correlation data.

According to an aspect of the present invention, there is provided a circuit specification description visualizing method, including: analyzing a syntax of a circuit specification description to create structure data about a partial expression included in the circuit specification description; creating data about a plurality of pass patterns for which the circuit specification description passes from the created structure data; creating waveform data about a waveform of at least one signal in a circuit defined by the circuit specification description based on data about each of the plurality of pass patterns created; creating correlation data that indicates a correlation between the waveform of the at least one signal and the partial expression included in the circuit specification description based on the data about each of the plurality of pass patterns; and outputting display data about a diagram showing the correlation between the partial expression included in the circuit specification description and the waveform of the at least one signal for each of the plurality of pass patterns based on the structure data, the waveform data and the correlation data.

BRIEF DESCRIPTION OF THE DRAWINGS

FIG. 15 is a diagram showing a comment displayed with a highlighted selected part; and FIG. 16 is a diagram illustrating a comment template for a function "$rose" shown in FIG. 15.

DETAILED DESCRIPTION OF THE INVENTION

In the following, embodiments of the present invention will be described with reference to the drawings.

First Embodiment

Configuration

Figure 1:
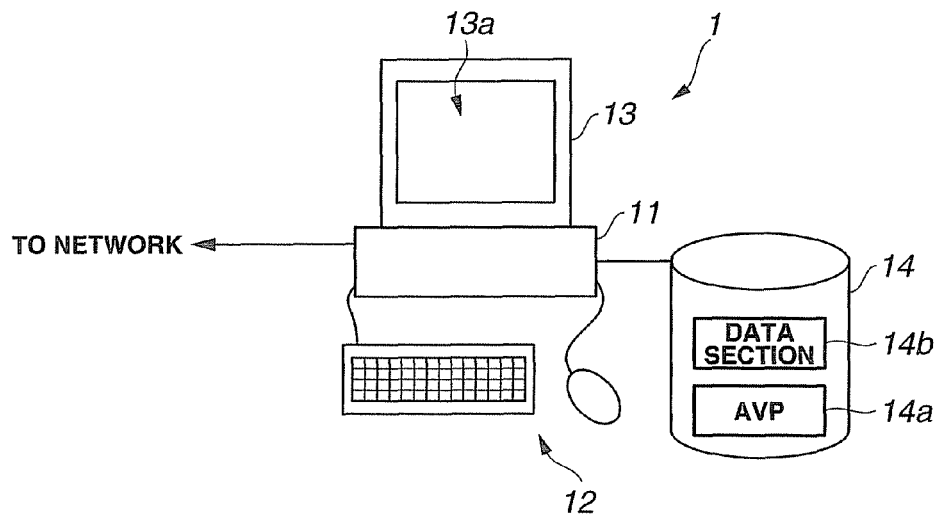
FIG. 1 is a structural diagram showing a configuration of a circuit specification description analyzing system according to a first embodiment of the present invention.

First, referring to FIG. 1, a configuration of a circuit specification description design analyzing device according to a first embodiment of the present invention will be described. FIG. 1 is a structural diagram showing a configuration of the circuit specification description design analyzing device according to the present embodiment. In the following description, the circuit specification description design analyzing device will be refereed to simply as a design analyzing device.

A design analyzing device 1 is a computer, such as a personal computer (PC), including a device main unit 11 including a central processing unit (CPU), a ROM, a RAM and the like, an input device 12, such as a keyboard and a mouse, a display device 13, and an external storage device 14, such as a hard disk drive. Design data created by a designer is stored in the external storage device (referred to also simply as a storage device hereinafter) 14. The external storage device 14 further stores an assertion visualization program (AVP) 14a configured to analyze and visualize a circuit specification description described later. The storage device 14 has a data section 14b, which is a region for storing data to be visualized.

A designer of a circuit of a semiconductor device uses the design analyzing device 1 to design the circuit. In particular, the designer can input a circuit specification described later using various types of languages.

The design analyzing device 1 visualizes the content of the designed circuit specification description as described later. Thus, the design analyzing device 1 can be also referred to as a circuit specification description visualizing device.

According to the present embodiment, the design analyzing device 1 is a single computer. However, in the case where a plurality of designers share the design analyzing device 1, the designers can access the design analyzing device as a central device through a network to which their respective terminal devices are connected and input and visualize the same circuit specification description.

The design analyzing device 1 serving as the circuit specification description visualizing device typically incorporates design supporting software, such as electronic design automation (EDA) and has a visualization processing section according to the present embodiment and other embodiments described later as a tool for executing a part of the capability of the software. In the following, the visualization processing section as the part of the capability will be described, and descriptions about processing sections responsible for the remainder of the capability will be omitted.

Figure 2:
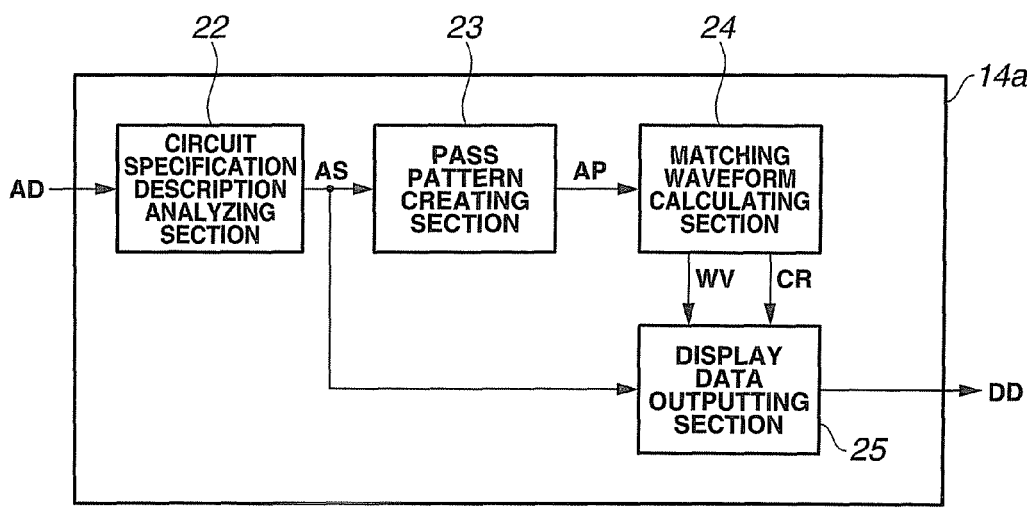
FIG. 2 is a block diagram showing a software configuration of an assertion visualization program of a design analyzing device according to the first embodiment of the present invention.

FIG. 2 is a block diagram showing a software configuration of an assertion visualization program of the design analyzing device 1.

As shown in FIG. 2, the assertion visualization program (AVP) 14a of the design analyzing device 1 is a visualization processing section including a circuit specification description analyzing section 22, a pass pattern creating section 23, a matching waveform calculating section 24, and a display data outputting section 25.

The circuit specification description analyzing section 22 receives an assertion description AD, which is a circuit specification description written by the designer, in the form of text data, analyzes the syntax of the assertion description AD, and creates assertion structure data AS, which is structure data about a partial expression in the circuit specification description.

The assertion structure data AS created by the circuit specification description analyzing section 22 is typically parse tree data. Here, the following assertion description will be described as an example.

a##[2:4]$rose(b) or c . . . (description example 1)

The assertion description of the description example 1 means that the whole is divided by "or" representing the OR operation, and there are three cases where the delay is 2, 3 and 4. The assertion structure data AS created by the circuit specification description analyzing section 22 is syntax tree data resulting from syntax analysis of the assertion description AD thereof. The syntax tree data is tree structure data of a partial expression in the assertion description AD. The pass pattern creating section 23 and the display data outputting section 25 use the assertion structure data AS.

The pass pattern creating section 23 reads in the assertion structure data AS and creates pass pattern data AP. The pass pattern data AP indicates a case where the described assertion passes. For example, in the case of the description example 1 of the assertion description AD described above, the pass pattern data AP indicates cases where the left-hand side of the OR (logical sum) operation passes, where the right-hand side of the OR operation passes, where the delay time is 2, and where the delay time is 3, for example. That is, the pass pattern creating section 23 creates a plurality of pieces of pass pattern data AP each representing a case where the assertion passes from the assertion structure data AS created by the circuit specification description analyzing section 22.

Figure 3:
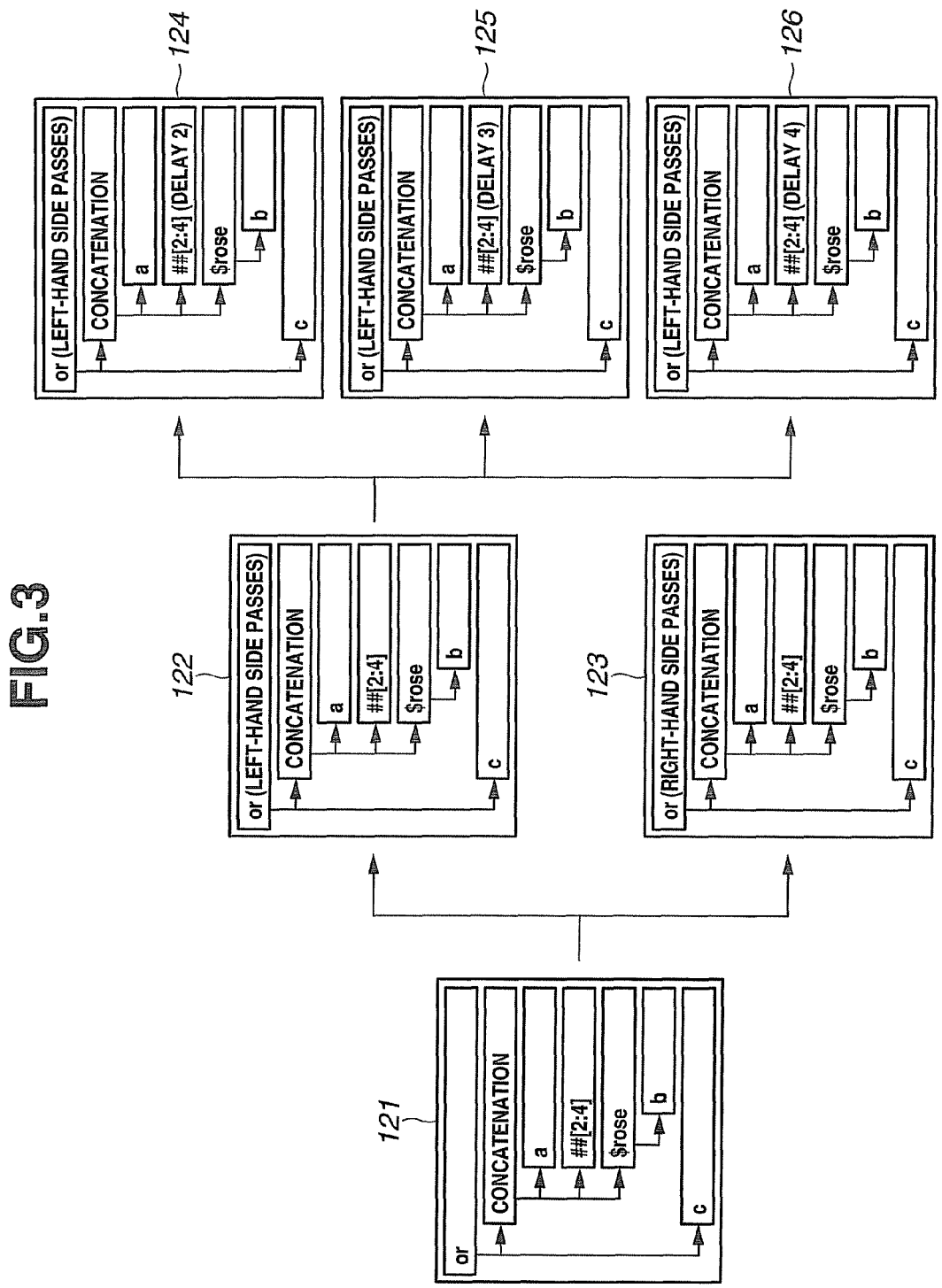
FIG. 3 is a diagram illustrating a processing performed by a pass pattern creating section according to the first embodiment of the present invention.

Next, referring to FIG. 3, a processing performed by the pass pattern creating section 23 will be described. FIG. 3 is a diagram illustrating a processing performed by the pass pattern creating section.

The pass pattern data AP output from the pass pattern creating section 23 indicates as many possible pass patterns of the assertion description as possible determined based on the assertion structure data AS. In the case of the description example 1, assertion structure data AS denoted by reference numeral 121 is read in. The assertion structure data AS 121 is first sorted into two cases, a case 122 where the left-hand side of the OR operation passes, and a case 123 where the right-hand side passes.

The case 122 is further sorted into three cases, a case 124 where the delay is 2, a case 125 where the delay is 3, and a case 126 where the delay is 4. The cases 123, 124, 125 and 126 cannot be further sorted. Therefore, the four cases are referred to as a pass pattern. The data indicating the four pass patterns is the pass pattern data AP used in the processing by the matching waveform calculating section 24.

The matching waveform calculating section 24 receives the pass pattern data AP and determines waveform data WV for which the assertion passes and correlation data CR indicating a correlation between the assertion structure and the waveform data for each pass pattern. The correlation data CR indicates the correlation between the waveform data WV and the partial expression in the assertion description AD.

Figure 4:
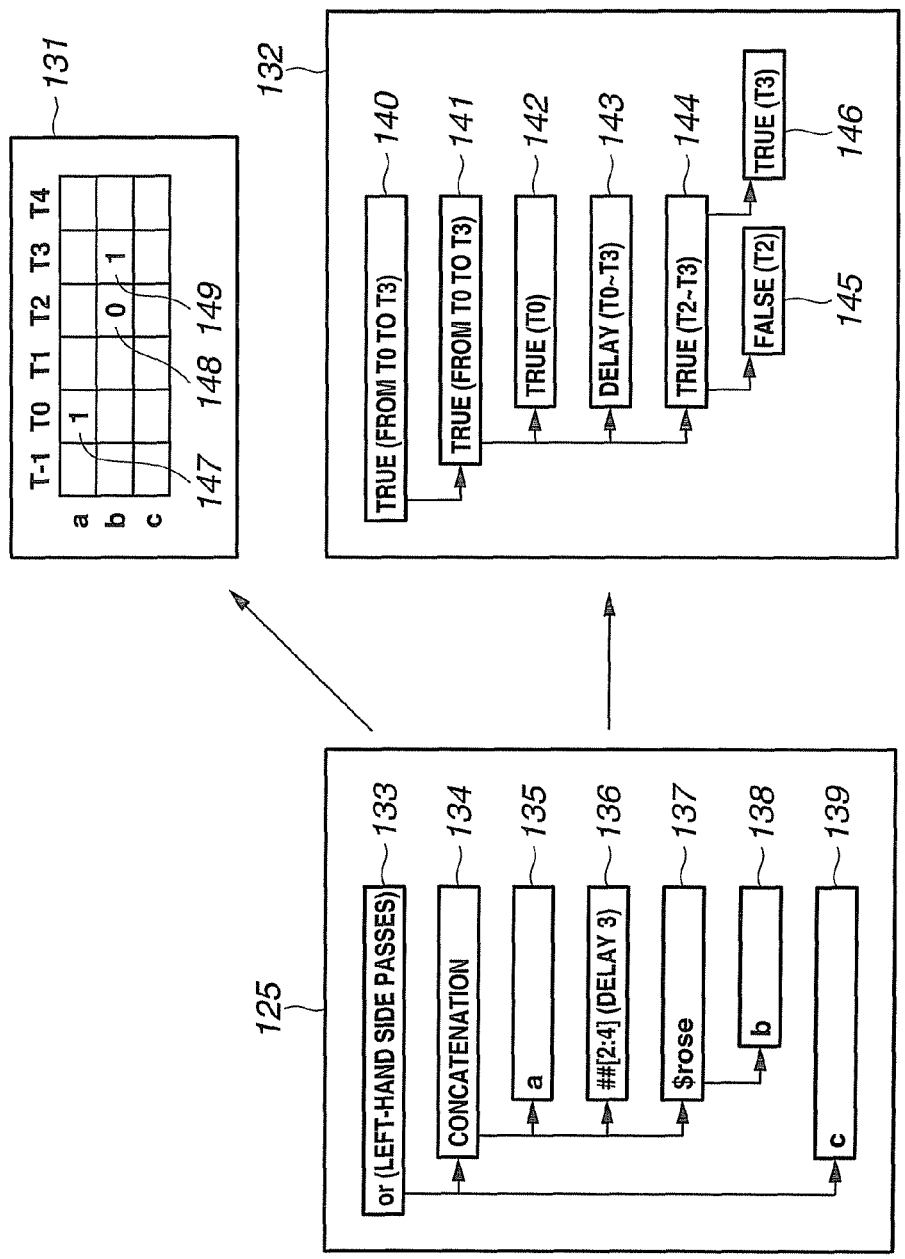
FIG. 4 is a diagram illustrating a processing performed by a matching waveform calculating section according to the first embodiment of the present invention.

With reference to FIG. 4, a processing performed by the matching waveform calculating section 24 will be described. FIG. 4 is a diagram illustrating a processing performed by the matching waveform calculating section.

A case 125 shown in FIG. 4 is the same as the case 125 shown in FIG. 3 and is a pass pattern in which the side on the left side of "or" in the assertion description AD passes, and the delay is 3.

The matching waveform calculating section 24 creates waveform data WV and correlation data CR as to the pass pattern. The matching waveform calculating section 24 doubles as a waveform data creating section configured to create waveform data WV about at least one signal in the circuit defined by the assertion description AD based on the data about each pass pattern created by the pass pattern creating section 23 and a correlation data creating section configured to create correlation data CR indicating a correlation between the waveform data WV about at least one signal and the partial expression in the assertion description AD based on the data about each pass pattern.

In FIG. 4, waveform data 131 in the of a table is shown as an example of the waveform data WV, and correlation data 132 is shown as an example of the correlation data CR.

The pass pattern of the case 125 will be described focusing on how the waveform data 131 and the correlation data 132 are determined. In general, in the syntax tree structure of the pass pattern data AP of the case 125, the waveform data 131 and the correlation data 132 are built by tracing the nodes of the syntax tree.

First, for a start cycle T0, consider a node 135, which is the first leaf of the assertion structure data AS of the case 125. The value of a signal a in the cycle T0 needs to be 1 in order for a logical expression "a", which is a partial expression, to pass. Therefore, the matching waveform calculating section 24 writes "1" in a field 147 of the table-like waveform data 131 and creates a node 142 indicating that the node 135 passes in the cycle T0 in the correlation data 132.

Then, consider a node 136 for the end cycle T0 of the node 142. Since the delay is 3, a node 143 indicating that the delay time spans from the cycle T0 to a cycle T3 is created.

Then, consider a node 137 for an end cycle T3 of the node 143. The node 137 is a node of a "$rose" (rise) operation, which is a partial expression, and the value of a signal b, which is an operand, needs to be 0 in the immediately preceding cycle T2 and 1 in the cycle T3. Therefore, the matching waveform calculating section 24 writes "0" in a field 148 and "1" in a field 149 of the waveform data 131.

The matching waveform calculating section 24 serving as a waveform creating section further creates a node 145 indicating that a node 138 does not pass in the cycle T2, a node 146 indicating that the node 138 passes in the cycle T3, and a node 144 indicating that the node 137 passes in the cycles T2 and T3 and provides links from the node 144 to the child nodes 145 and 146.

Then, consider a processing of the node 134. The node 134 is a concatenation operation, the start cycle of the node 142 corresponding to the node 135, which is the first operand, is T0, and the end cycle of the node 144 corresponding to the node 137, which is the last operand, is T3. Therefore, the matching waveform calculating section 24 creates a node 141 indicating that the operation of the node 134 passes in the cycles T0 to T3 and provides links from the node 141 to the child nodes 142, 143 and 144.

Finally, consider a root node 133. Since the left-hand side (a##[2:4]$rose(b)) passes in the present case, the matching waveform calculating section 24 creates a node 140 indicating that the operation of the node 133 passes in the cycles T0 to T3 as in the case of the node 134 corresponding to the left-hand side and provides a link to the child node 141. A node 139 corresponding to the right-hand side of the node 133 does not have to be traced.

Although the case does not occur in the case 125 described above, if a value needs to be written in a field of the waveform data 131 already filled with a different value, it means that it is impossible to create such a waveform, so that the pass pattern is discarded.

The above description concerns the case 125. However, in the other cases, the waveform data WV and the correlation data CR are created and supplied to and used by the display data outputting section 25 in the same way. Based on the assertion structure data AS, the waveform data WV and the correlation data CR, the display data outputting section 25 creates a diagram indicating a correlation between the partial expression in the assertion description AD and the signal waveform, such as one described later, for four patterns in the present embodiment.

The storage device 14 stores the assertion structure data AS, the pass pattern data AP, the waveform data WV and the correlation data CR in the data section 14b.

Figure 5:
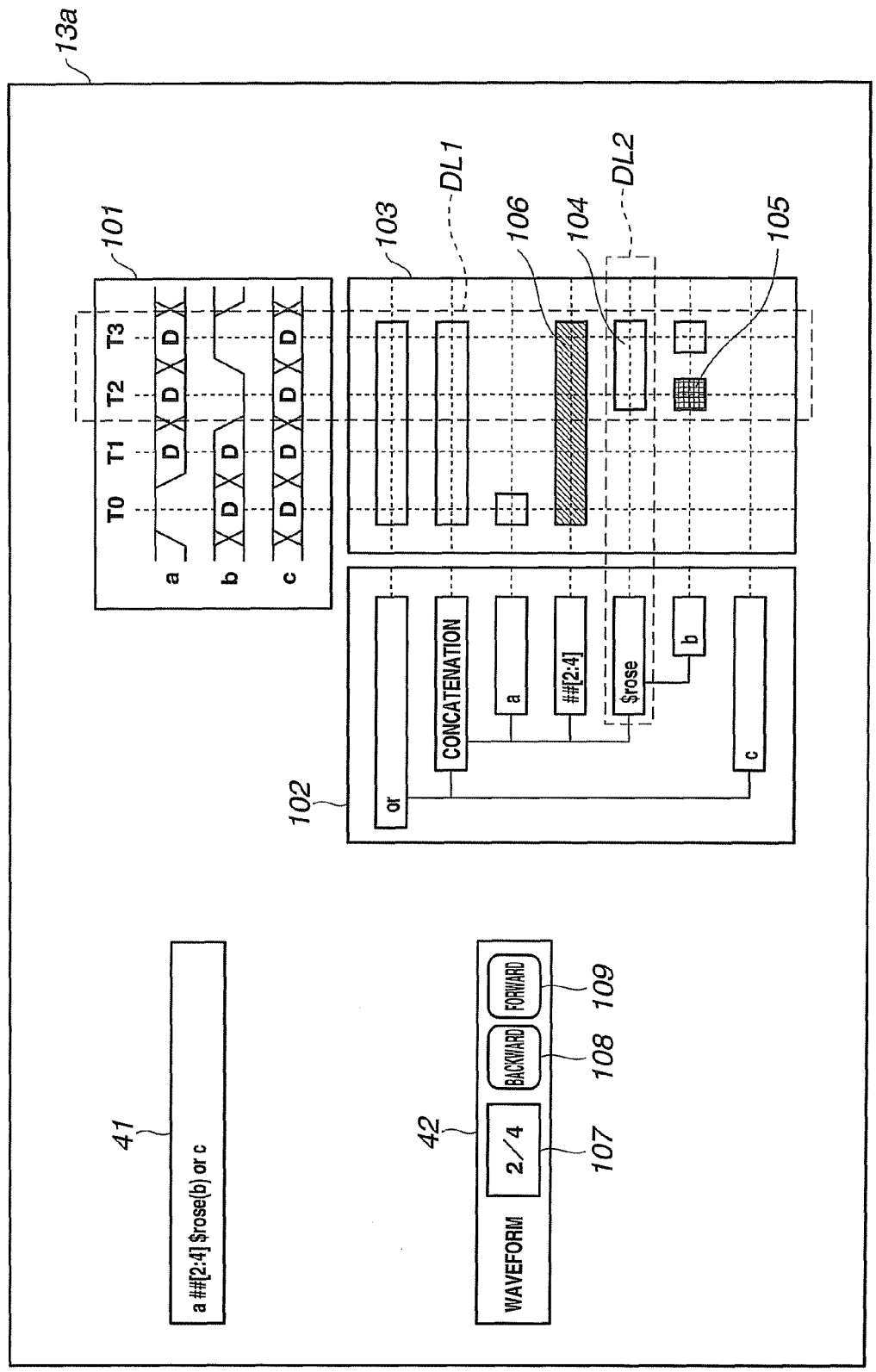
FIG. 5 is a diagram showing an example of a screen displayed on a screen displaying section according to the first embodiment of the present invention.

Based on the assertion structure data AS, the waveform data WV and the correlation data CR, the display data outputting section 25 creates and outputs display data DD displayed in a screen displayed on a screen display section 13a of the display device 13 (FIG. 5). In the displayed screen, a visualized correlation between each partial expression and each waveform for each case of assertion is displayed so that the designer can easily understand the meaning of the assertion.

FIG. 5 is a diagram showing an example of the screen displayed on the screen display section 13a of the display device 13.

The designer can visualize an assertion in the design data by inputting or specifying a predetermined command to display the screen shown in FIG. 5 on the display device 13. FIG. 5 shows a result in the case where an assertion description is input.

The screen display section 13a of the display device 13 includes a visualization target assertion displaying section 41, a waveform selecting section 42, a waveform displaying section 101, a structure displaying section 102 and a correlation displaying section 103.

The visualization target assertion displaying section 41 displays an assertion that the designer wants to visualize. Display of an assertion is achieved by the user directly entering a desired assertion in the visualization target assertion displaying section 41 or selecting an assertion from a plurality of assertion descriptions displayed in another window or the like, for example. Since the assertion that the user wants to visualize is displayed in the visualization target assertion displaying section 41 on the screen display section 13a, the user can easily check the content of the assertion to be analyzed. In the visualization target assertion displaying section 41 shown in FIG. 5, the assertion of the description example 1 described above is input or selected for visualization.

The waveform selecting section 42 is used to select a pass pattern waveform from one or more pass pattern waveforms for which the assertion passes. The waveform selecting section 42 includes a waveform number displaying section 107, a backward button 108 and a forward button 109. In FIG. 5, "2/4" is displayed in the waveform number displaying section 107. This means that the second waveform pattern in the four patterns is selected. That is, the left-hand side indicates the rank, and the right-hand side indicates the total number of pass patterns.

The designer, or the user, can change the displayed pass pattern waveform by manipulating a mouse to place a cursor on the backward button 108 or the forward button 109 and clicking. For example, if the backward button 108 is clicked in the state shown in FIG. 5, the first pattern waveform is displayed. In the present case, the waveform number displaying section 107 displays "1/4". Alternatively, if the forward button 109 is clicked in the state shown in FIG. 5, the third pattern waveform is displayed. In the present case, the waveform number displaying section 107 displays "3/4".

Thus, the waveform selecting section 42 forms a pattern selecting section configured to allow selection of a pass pattern displayed on the screen shown in FIG. 5.

Although the example described above is an extremely simplified example, various methods including using a slider or other component other than the button, using a keyboard to input a waveform number, and selecting from a list can be used.

In FIG. 5, the waveform displaying section 101, the structure displaying section 102 and the correlation displaying section 103 form a diagram showing correlations between partial expressions and waveforms. That is, the diagram showing correlations including the waveform displaying section 101, the structure displaying section 102 and the correlation displaying section 103 shows a correlation between each partial expression in the assertion description AD and a waveform of each signal.

The waveform displaying section 101 displays a waveform diagram showing one or more signal waveforms of the selected pass pattern. In FIG. 5, the waveform displaying section 101 displays three signal waveforms of the second pass pattern. In the example shown in FIG. 5, the value of the signal a is "1" in the cycle T0 and is arbitrary (indicated by D) in the other cycles, the value of the signal b is "0" in the cycle T2, is "1" in the cycle T3 and is arbitrary in the other cycles, and the value of the signal c is arbitrary in all the cycles. In the waveform displaying section 101, in a part at which the value is defined by the assertion description AD, the defined value is set and displayed, and in a part at which no value is defined, the predetermined symbol "D" indicating ambiguity is displayed. That is, in the waveform displaying section 101, a waveform diagram showing a waveform of at least one signal at a plurality of times is displayed based on the waveform data WV.

The structure displaying section 102 displays a structure of an assertion. In FIG. 5, a tree structure resulting from syntax analysis of the assertion description of the description example 1 is shown in the form of a tree structure of partial expressions.

The correlation displaying section 103 displays a correlation between each part of the one or more waveforms displayed in the waveform displaying section 101 and each part of the structure of the assertion displayed in the structure displaying section 102. In the correlation displaying section 103, three types of band-like symbols are used. A white band represents a period in which the whole of the assertion or each partial expression passes, a mesh band represents a period in which the whole of the assertion or each partial expression does not pass, and a diagonally shaded band represents a period of delay.

Each band displayed in the correlation displaying section 103 is horizontally aligned with each waveform in the waveform displaying section 101 with regard to the times therein and vertically aligned with a corresponding one of the partial expressions in the structure displaying section 102.

For example, a band part 104 shown as a white band is displayed at a horizontal position corresponding to the period from the cycle T2 to the cycle T3 in the waveform displaying section 101 as shown by a dotted line DL1 and at a vertical position corresponding to the node "$rose" in the structure displaying section 102 as shown by a dotted line DL2. This means that the partial expression "$rose(b)" is passes in the part from the cycle T2 to the cycle T3 in the waveform.

A band part 105 shown as a mesh band is displayed at a horizontal position corresponding to the period of the cycle T2 in the waveform displaying section 101 and at a vertical position corresponding to the node "b" in the structure displaying section 102. This means that the partial expression "b" does not pass in the part of the cycle T2 in the waveform.

A band part 106 shown as a diagonally shaded band is displayed at a horizontal position corresponding to the period from the cycle T0 to the cycle T3 in the waveform displaying section 101 and at a vertical position corresponding to the node "##[2:4]" in the structure displaying section 102. This means that the part from the cycle T0 to the cycle T3 in the waveform corresponds to the delay time of the partial expression "##[2:4]".

As described above, the correlation displaying section 103 shows to which part of the waveform each partial expression corresponds.

As described above, the diagram showing correlations including the waveform displaying section 101, the structure displaying section 102 and the correlation displaying section 103 shows a correlation between each partial expression in the assertion description AD and a waveforms of each signal.

Thus, the user can easily recognize to which part of the waveform a band part indicating a correlation corresponds and to which partial expression the band part corresponds.

Therefore, from the screen shown in FIG. 5, the user can easily recognize which period in the waveform for the pass pattern selected for a desired assertion corresponds to which partial expression in the assertion.

(Operation)

Next, an operation of the design analyzing device 1 will be described. In response to a predetermined command input by the designer through the input device 12 and the display device 13 connected to the device main unit 11, the design analyzing device 1 executes the assertion visualization program (AVP) 14a to perform a predetermined assertion visualization processing.

Figure 6:
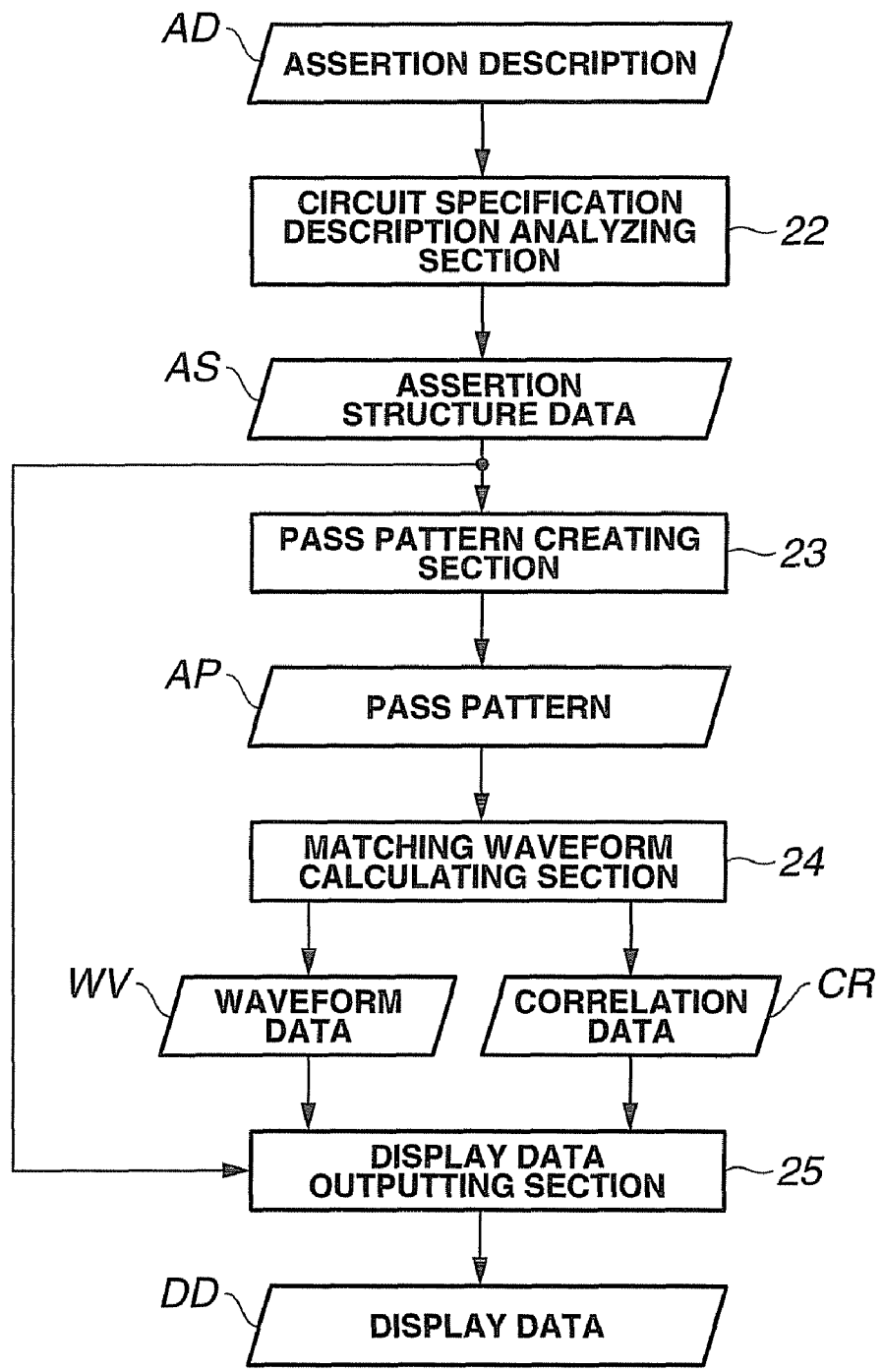
FIG. 6 is a flowchart showing an example of a flow of an assertion visualization processing performed by the design analyzing device according to the first embodiment of the present invention.

FIG. 6 is a flowchart illustrating an example of a flow of the assertion visualization processing performed by the design analyzing device 1. The assertion visualization program (AVP) 14a, which is a circuit specification description visualization program, is previously stored in the storage device 14 and read and executed by the CPU of the device main unit 11 in response to a predetermined command. In the following, an operation in the case of the assertion of the description example 1 described above will be described.

First, the screen display section 13a described above shown in FIG. 5 is displayed. When the user inputs or selects an assertion to be visualized, the input or selected assertion is displayed in the visualization target assertion displaying section 41 on the screen display section 13a.

Then, when a predetermined command is input, the processing shown in FIG. 6 is performed.

First, the circuit specification description analyzing section 22 analyzes the syntax of an assertion description AD in the form of text data specified by the user and creates assertion structure data AS, which is circuit specification description structure data, and the assertion structure data AS is stored in the data section 14b of the storage device 14. The created assertion structure data AS is parse tree data in the present embodiment.

Then, based on the assertion structure data AS, the pass pattern creating section 23 creates pass pattern data AP and stores the pass pattern data PA in the data section 14b. As described above, the pass pattern data AP is data indicating a case where the described assertion passes. In the case of the assertion of the description example 1, the pass pattern data AP indicates the four cases of pass pattern 123 to 126 shown in FIG. 3.

Based on the pass pattern data AP, the matching waveform calculating section 24 calculates waveform data WV for which the assertion passes and correlation data CR between the assertion structure and the waveform data for each pass pattern as shown in FIG. 4 and stores the waveform data WV and the correlation data CR in the data section 14b.

Based on the assertion structure data AS, the waveform data WV and the correlation data CR, the display data outputting section 25 creates display data DD about the screen including the diagram indicating the correlation shown in FIG. 5 displayed on the screen display section 13a and outputs the display data DD.

The display data DD includes the waveform displaying section 101, the structure displaying section 102 and the correlation displaying section 103 shown in FIG. 5 and further includes data that allows display of band parts indicating correlations in the correlation displaying section 103 at such positions that the band parts indicate correlations between the waveforms in the waveform displaying section 101 and the partial expressions in the structure displaying section 102 as described above.

Once the assertion to be visualized is specified, in the case of the description example 1, first, the display data outputting section 25 creates data so that the waveform displaying section 101 including a waveform diagram for the first pass pattern "1/4" described above, the structure displaying section 102, and the correlation displaying section 103 are displayed.

As described above, if there are a plurality of pass patterns, a desired pass pattern can be selected from among the plurality of pass patterns in the waveform selecting section 42, and thus, a correlation between each waveform and each partial expression can be easily recognized for each pass pattern.

Therefore, the designer can easily understand the meaning of the assertion and modify the assertion.

In the example described above, the matching waveform calculating section 24 creates waveform data and the like for all the pass patterns, four patterns in the case of the description example 1, at once. However, the matching waveform calculating section 24 may create the waveform data WV and the correlation data CR each time a pattern is selected in the waveform selecting section 42.

As described above, the design analyzing device 1 according to the present embodiment displays a correlation between each waveform and each partial expression for each pass pattern of the assertion description in such a manner the designer can easily recognize the correlation. Therefore, the designer can easily understand the meaning of the assertion and modify the assertion.

Second Embodiment

A design analyzing device according to a second embodiment differs from the design analyzing device according to the first embodiment in that, when a part of the correlation or a part of the waveform is specified in the diagram showing the correlation, a part of the waveform and a partial expression corresponding to the specified part of the correlation or a part of the correlation and a partial expression corresponding to the specified part of the waveform are displayed in a distinguishable manner.

The configuration of the design analyzing device according to the second embodiment is the same as the configuration of the design analyzing device according to the first embodiment. However, in order to provide the display described above, the design analyzing device uses a different data structure as described later. As described later, one piece of waveform data WV is created for each part of the correlation in the present embodiment, while one piece of waveform data WV is created for each pass pattern in the first embodiment.

An example of the display provided by the design analyzing device according to the second embodiment will be described. The same components as those in the first embodiment are denoted by the same reference numerals, and descriptions thereof will be omitted.

Figure 7:
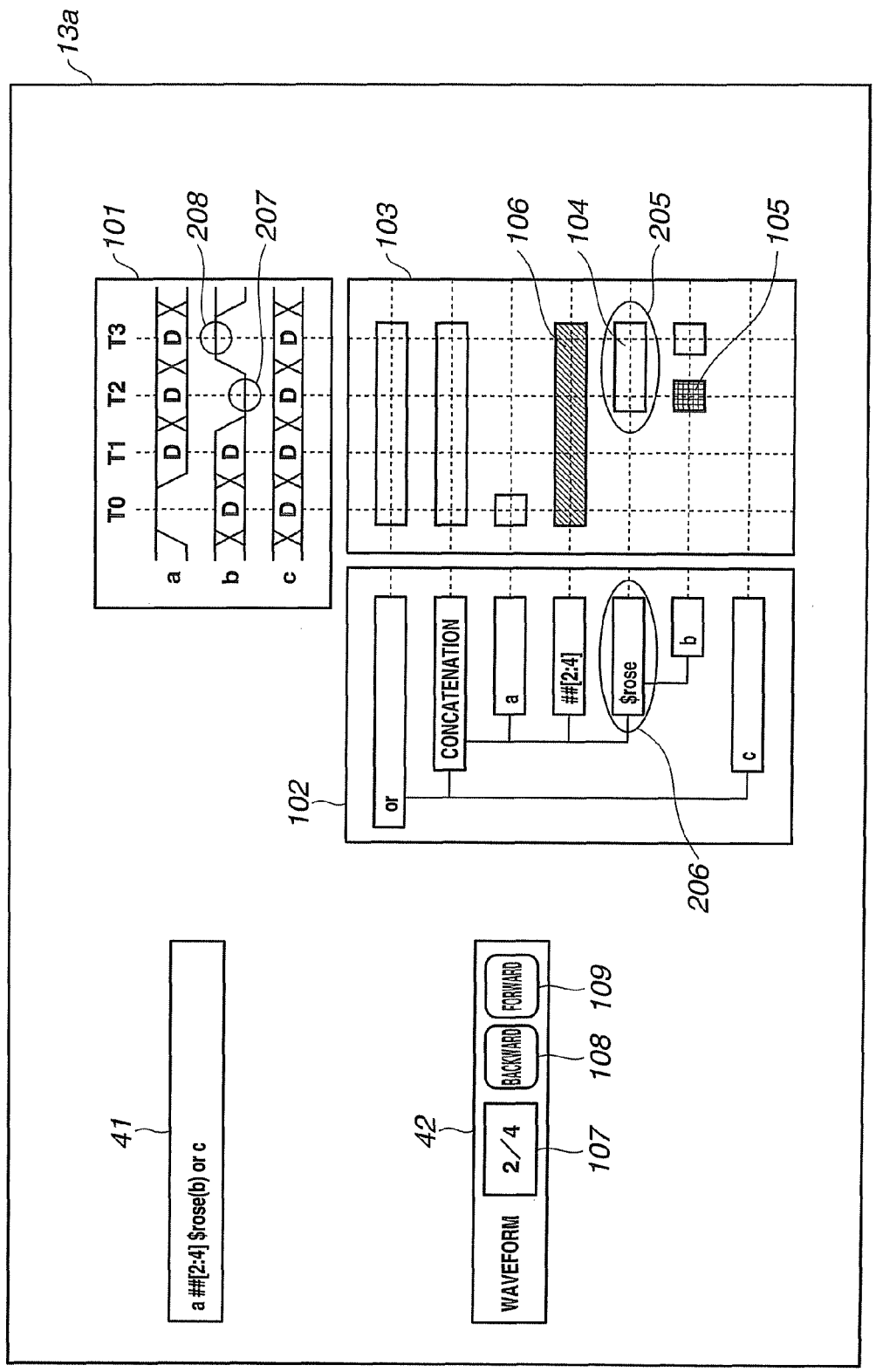
FIG. 7 is a diagram showing an example of the screen according to a second embodiment of the present invention.

FIG. 7 is a diagram showing an example of the screen displayed in the case where the case 125 in the assertion description of the description example 1 described above is selected.

If the designer is focusing attention on the band part 104 in the correlation displaying section 103, the designer can inform the design analyzing device 1 that the designer is focusing attention on the band part 104 by clicking the band part 104, which indicates a part of the correlation, with a mouse, for example.

As shown in FIG. 7, for the case 125 of the description example 1, when the band part 104 in the correlation displaying section 103 is clicked with a mouse, parts of a waveform corresponding to the band part 104 are indicated by circles 207 and 208 in the waveform displaying section 101. In this way, the corresponding parts of the waveform are displayed in such a manner that the parts can be distinguished from the other parts of the waveform by the circles 207 and 208.

At the same time, a part corresponding to the node of the partial expression "$rose" in the structure displaying section 102 is indicated by a circle 206. That is, the corresponding partial expression is displayed in such a manner that the part can be distinguished from the other partial expressions by the circle 206.

As can be seen from FIG. 7, in the case where the designer is focusing attention on the band part 104, which is indicated by a white band symbol in the correlation displaying section 103, in the desired assertion description AD, the designer can check the correlation between the waveform part and the partial expression corresponding to the band part 104 by clicking the band part 104 with a mouse to inform the design analyzing device that the designer is focusing attention on the band part 104.

As described above, in the waveform displaying section 101, the parts of the waveform corresponding to the band part 104 on which the designer is focusing attention are highlighted by the circles 207 and 208. In addition, in the structure displaying section 102 in which the tree structure of the assertion description is displayed, the part of the assertion description corresponding to the band part 104 on which the designer is focusing attention is highlighted by the circle 206.

In addition, in the correlation displaying section 103, the band part 104 on which the designer is focusing attention is highlighted by a circle 205.

In the correlation displaying section 103, a correlation between each part of the waveform displayed in the waveform displaying section 101 and each partial expression in the assertion structure displayed in the structure displaying section 102 is displayed. In the correlation displaying section 103, three types of band symbols are used to indicate different correlations. The meanings of the three types of band symbols are the same as those shown in FIG. 5.

Figure 8:
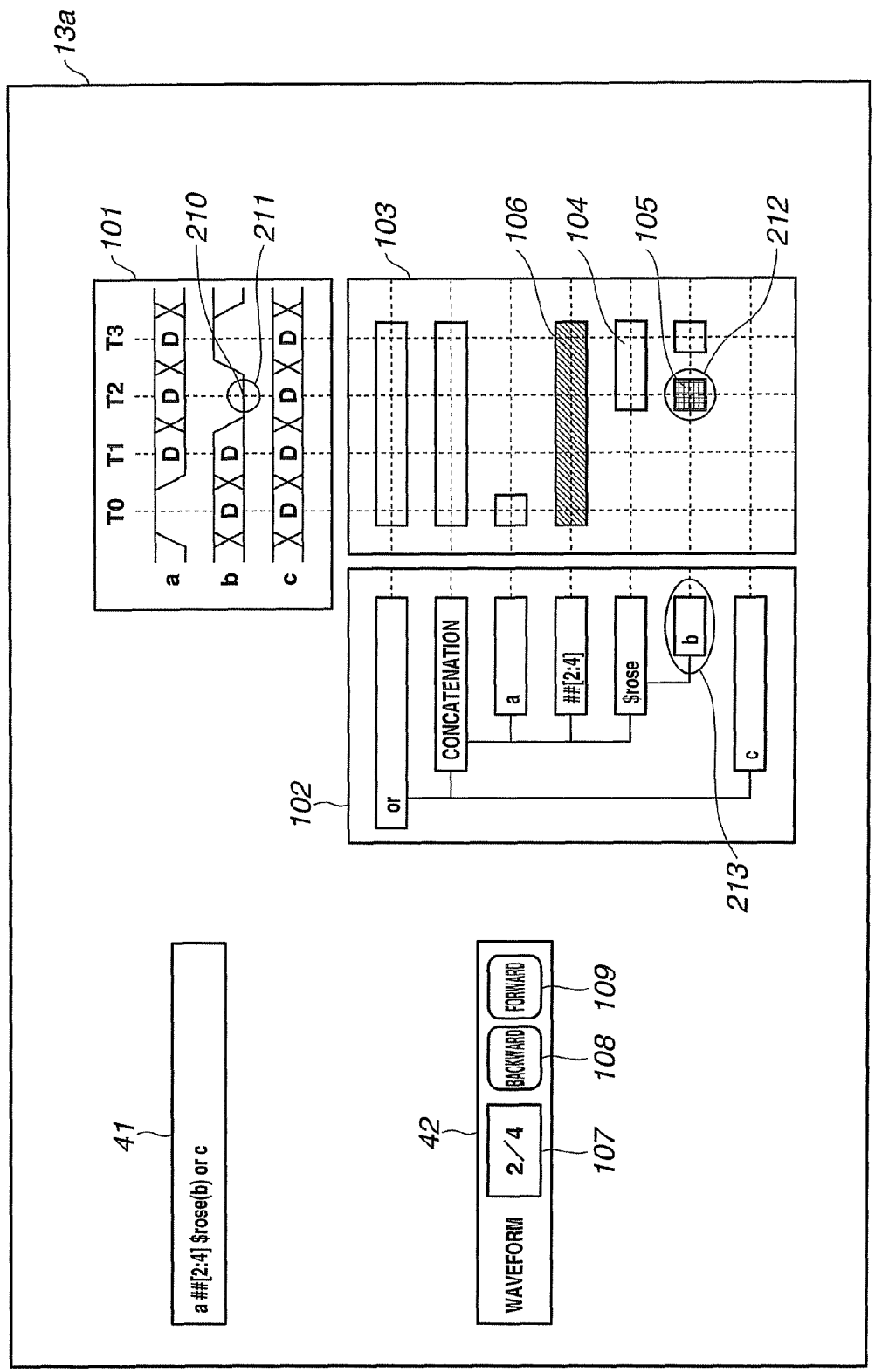
FIG. 8 is a diagram showing another example of the screen according to the second embodiment of the present invention.

FIG. 8 is a diagram showing another example of the screen displayed in the case where the case 125 in the assertion description of the description example 1 described above is selected.

If the designer is focusing attention on a waveform part 210 indicating that the value of the signal b is "0" in the cycle T2 in the waveform displaying section 101, the designer can inform the design analyzing device 1 that the designer is focusing attention on the waveform part 210 by clicking the waveform part 210 with a mouse, for example.

As shown in FIG. 8, for the case 125 of the description example 1, when the waveform part 210 in the waveform displaying section 101 is clicked with a mouse, a circle 211 is displayed to indicate that a part indicating that the value of the signal b is "0" in the waveform displaying section 101 is selected.

Then, a band part corresponding to the waveform part 210 is indicated by a circle 212 in the correlation displaying section 103. Furthermore, a node of a partial expression corresponding to the waveform part 210 in the structure displaying section 102 is indicated by a circle 213 so that the partial expression can be distinguished from the other partial expressions.

In this way, the band part in the correlation displaying section 103 and the partial expression in the structure displaying section 102 that correspond to the waveform part on which the designer is focusing attention are displayed in such a manner that the band part and the partial expression can be distinguished from those corresponding to the other waveform parts by the circles 212 and 213, respectively.

As described above, in the structure displaying section 102 in which the tree structure of the assertion description is displayed, the part of the assertion description corresponding to the waveform part 210 on which the designer is focusing attention is highlighted by the circle 213. In addition, in the correlation displaying section 103, the band part 105 corresponding to the waveform part 210 selected in the waveform displaying section 101 is highlighted by the circle 212.

When the designer specifies a waveform part on which the designer is focusing attention, the design analyzing device according to the present embodiment displays the band part and the partial expression corresponding to the specified waveform part in such a manner that the band part and the partial expression can be distinguished from the band parts and the partial expressions corresponding to the other waveform parts. Therefore, the designer can easily understand the meaning of the assertion and modify the assertion.

To provide such an distinguishable display, when a pass pattern is input to the matching waveform calculating section 24, the matching waveform calculating section 24 determines the waveform data WV for which the assertion passes and the correlation data CR indicating the correlation between the assertion structure and the waveform for each pass pattern. In this processing, the matching waveform calculating section 24 creates data having a data structure described below as the waveform data WV and the correlation data CR.

Figure 9:
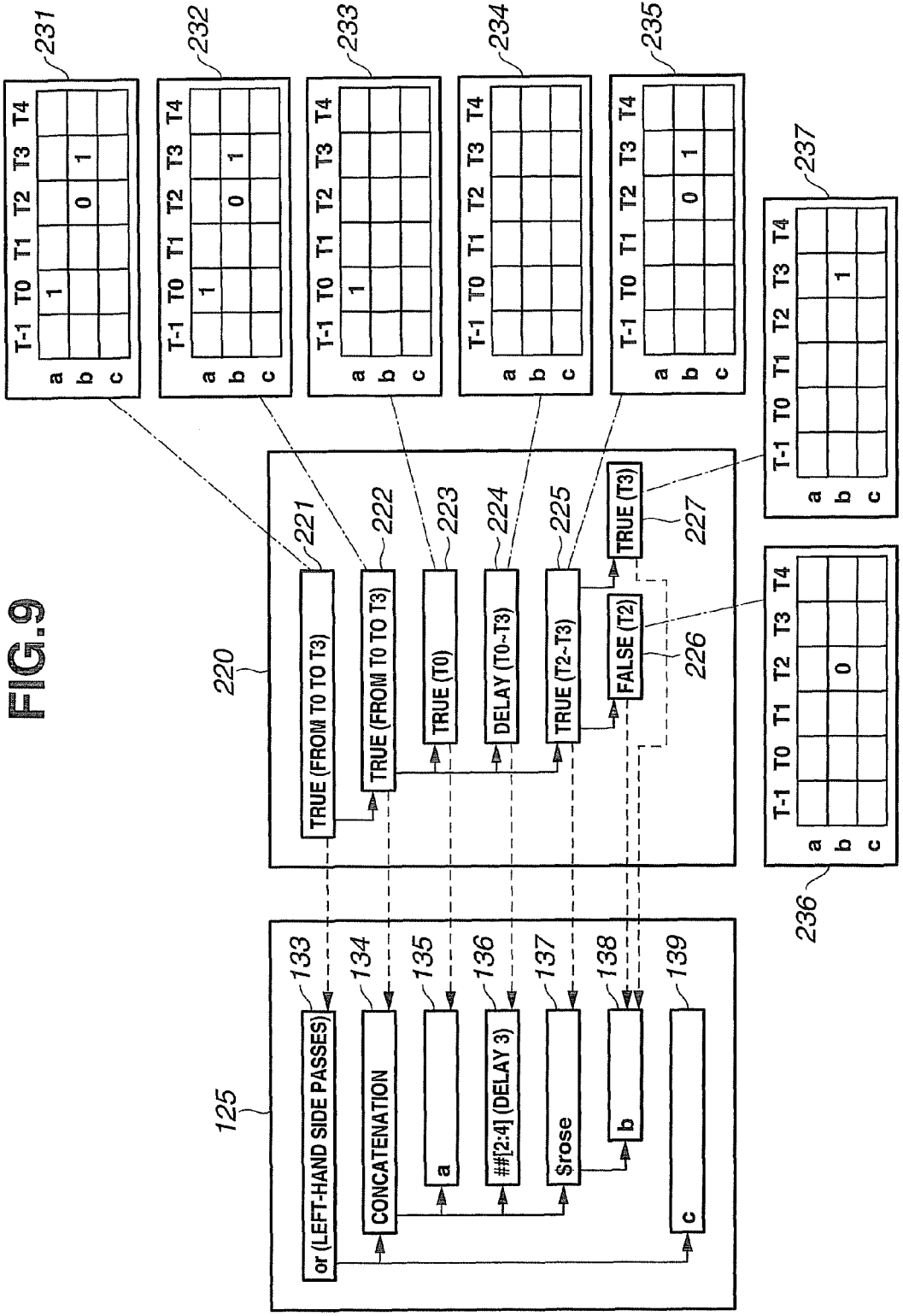
FIG. 9 is a diagram illustrating a processing performed by the matching waveform calculating section according to the second embodiment of the present invention.

With reference to FIG. 9, a processing performed by the matching waveform calculating section 24 according to the present embodiment will be described. FIG. 9 is a diagram illustrating a processing performed by the matching waveform calculating section 24 according to the present embodiment. A case 125 shown in FIG. 9 is the same as the case 125 shown in FIG. 3 and is a pass pattern in which the left-hand side of the OR operation passes, and the delay is 3. A case where waveform data 231 and correlation data 220 are determined for the pass pattern will be considered.

The present embodiment differs from the first embodiment in that, when the waveform data WV and the correlation data CR are stored, the waveform data is stored in a plurality of regions each provided for one of the nodes of the correlation data in the correlation displaying section 103 as shown in FIG. 9, rather than stored in a single region. In FIG. 9, nodes 221 to 227, each of which is a part of the correlation, are connected to waveform data 231 to 237, respectively, by an alternate long and short dash line.

The waveform data 231 for the root node is waveform data for the whole. In creating the nodes in the correlation data 220, links from the nodes to their respective corresponding nodes 133 to 139 in the pass pattern 125, which are not needed in the first embodiment, are provided. The links are shown by the dotted arrow in FIG. 9.

The correlation data 220 and the waveform data for the nodes in the correlation data 220 are built by tracing the nodes in the pass pattern 125.

First, for the start cycle T0, consider the node 135. The value of the signal a in the cycle T0 needs to be "1" in order for the logical expression "a" to pass. Therefore, the matching waveform calculating section 24 creates the node 223 indicating that the node 135 passes in the cycle T0 in the correlation data 220 and writes "1" as the value of "a" in the cycle T0 in the waveform data 233 corresponding to the correlation data 220.

Then, consider the node 136 for the end cycle T0 of the node 223. Since the delay is 3, the matching waveform calculating section 24 creates the node 224 indicating that the delay time spans from the cycle T0 to a cycle T3.

Then, consider the node 137 for the end cycle T3 of the node 224. The node 137 is a node of the "$rose" (rise) operation, and the value of the signal b, which is an operand, needs to be "0" in the immediately preceding cycle T2 and "1" in the cycle T3. Therefore, the matching waveform calculating section 24 creates the node 226 indicating that the node 138 does not pass in the cycle T2, the node 227 indicating that the node 138 passes in the cycle T3 and the node 225 indicating that the node 137 passes in the cycles T2 and T3 and provides links from the node 225 to the child nodes 226 and 227.

Furthermore, the matching waveform calculating section 24 writes "0" as the value of the signal b in the cycle T2 in the waveform data 236 for the node 226 and "1" as the value of the signal b in the cycle T3 in the waveform data 237 for the node 227. Then, the matching waveform calculating section 24 stores a result of merging of the waveform data 236 and 237 for the child nodes 226 and 227 as waveform data 235 for the node 225. The term "merging" used herein refers to a process of writing the values "0" and "1" written in the waveform data for the child nodes into the corresponding fields of the waveform data for the parent node.

Then, consider a processing of the node 134, which is a concatenation operation. Since the start cycle of the node 223 corresponding to the node 135, which is the first operand, is T0, and the end cycle of the node 225 corresponding to the node 137, which is the last operand, is T3, the matching waveform calculating section 24 creates the node 222 indicating that the operation of the node 134 passes in the cycles T0 to T3 and provides links from the node 222 to the child nodes 223, 224 and 225.

Furthermore, the matching waveform calculating section 24 stores a result of merging of the waveform data 233, 234 and 235 for the child nodes 223, 224 and 225 in the waveform data 232 for the node 222.

Finally, consider the root node 133. Since the left-hand side passes in the present case, the matching waveform calculating section 24 creates the node 221 indicating that the operation of the node 133 passes in the cycles T0 to T3 as in the case of the node 134 corresponding to the left-hand side and provides a link from the node 221 to the child node 222.

Furthermore, the matching waveform calculating section 24 copies the waveform data 232 for the node 222 into the waveform data 231 for the node 221. The waveform data 231 is the final waveform data for the whole of the assertion for the pass pattern 125. The node 139 corresponding to the right-hand side of the node 133 does not have to be traced.

Although the case does not occur in the example described above, if a value needs to be written in a field of the waveform data already filled with a different value in the course of the merging or other processing involving writing a value in the waveform data for each node, it means that it is impossible to create such a waveform, so that the pass pattern 125 is discarded.

Then, the display data outputting section 25 creates the waveform diagram in the waveform displaying section 101 based on the waveform data created for each node in the correlation displaying section 103.

In the data structure created as described above, each node of the correlation data associates a node of the assertion structure data with a part of the waveform data. As a result, the highlight function described above with reference to FIGS. 7 and 8 can be provided.

As described above, when a part of the correlation or a part of the waveform is specified in the diagram showing the correlation, the design analyzing device according to the present embodiment displays a part of the waveform and a partial expression corresponding to the specified part of the correlation or a part of the correlation and a partial expression corresponding to the specified part of the waveform in a distinguishable manner.

Therefore, in addition to the advantages of the first embodiment, the design analyzing device according to the present embodiment has an advantage that a correlation between each waveform and each partial expression for each pass pattern of the assertion description can be displayed in a distinguishable manner for the designer. Therefore, the designer can more easily understand the meaning of the assertion and modify the assertion. In particular, the designer can more easily recognize which part of a signal, or which period in a waveform, corresponds to which part of the assertion.

Third Embodiment

A design analyzing device according to a third embodiment differs from the design analyzing device according to the second embodiment in that, when a part of the correlation or a part of the waveform is specified, a part of the correlation and a partial expression having a parent-child relationship with the specified part of the correlation are displayed in a distinguishable manner.

The configuration of the design analyzing device according to the third embodiment including the data structure thereof is the same as the configuration of the design analyzing device according to the second embodiment.

An example of the display provided by the design analyzing device according to the third embodiment will be described. The same components as those in the second embodiment are denoted by the same reference numerals, and descriptions thereof will be omitted.

Figure 10:
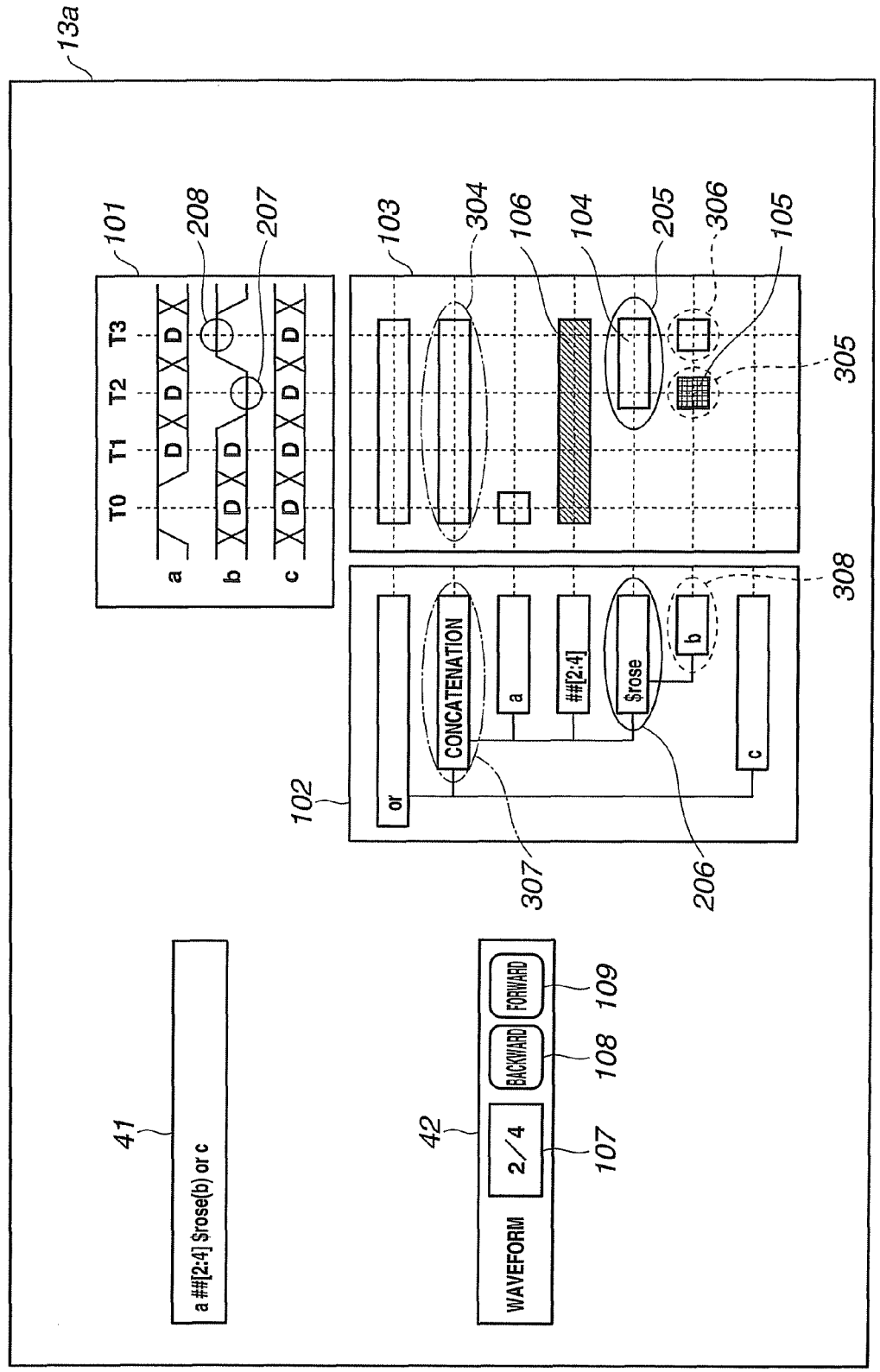
FIG. 10 is a diagram showing an example of the screen according to a third embodiment of the present invention.

FIG. 10 is a diagram showing an example of the screen displayed in the case where the case 125 in the assertion description of the description example 1 described above is selected. In the following, a screen display method according to the present embodiment will be described.

When the designer is focusing attention on the band part 104 in the correlation displaying section 103, if the designer clicks the band part 104 with a mouse, a partial expression in the assertion corresponding to the band part 104 on which the designer is focusing attention is highlighted by the solid line circle 206. Furthermore, in the structure displaying section 102, a parent node and a child node of the partial expression highlighted by the solid line circle 206 are highlighted by an alternate long and short dash line circle 307 and a dotted line circle 308, respectively.

As in the correlation displaying section 103 shown in FIG. 7, three types of band symbols are used in the correlation displaying section 103, and the band part 104 on which the designer is focusing attention is highlighted by the solid line circle 205.

Furthermore, in the correlation displaying section 103, a parent node and child nodes of the node highlighted by the solid line circle 205 are highlighted by an alternate long and short dash line circle 304 and dotted line circles 305 and 306, respectively.

As shown in FIG. 10, parts of a waveform corresponding to the band part 104 on which the designer is focusing attention can also be highlighted by the solid line circles 207 and 208.

As described above and shown in FIG. 10, when the designer selects a band part 104 on which the designer is focusing attention, a node corresponding to the band part 104 and parent and child nodes of the node are highlighted in the structure displaying section 102, and the band part 104 and parent and child nodes of the band part 104 are highlighted in the correlation displaying section 103. That is, when a part of the correlation is specified in the correlation displaying section 103, a part of the correlation having a parent-child relationship with the specified part of the correlation and a partial expression having a parent-child relationship with a partial expression corresponding to the specified part of the correlation are displayed in a distinguishable manner.

Figure 11:
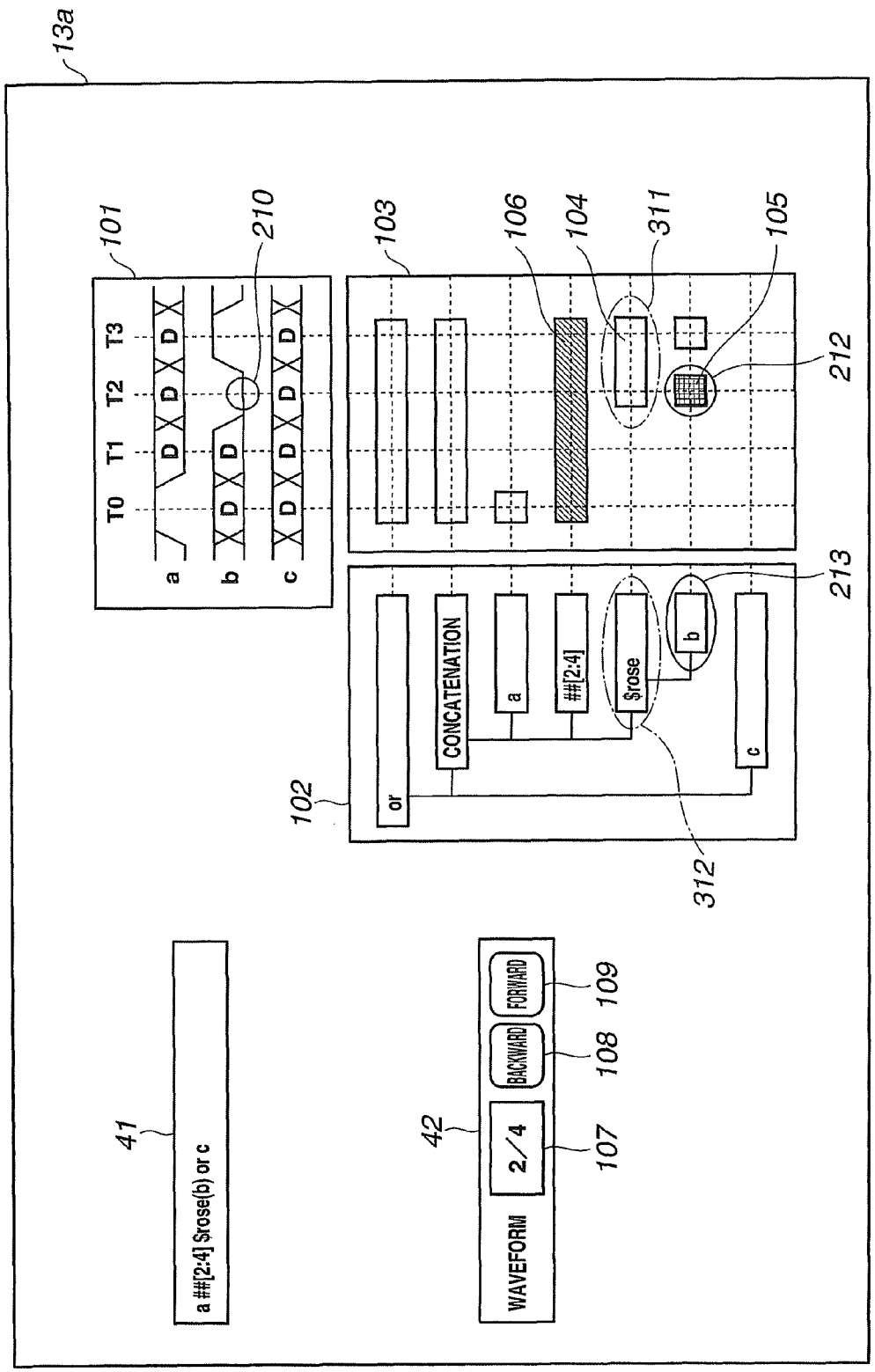
FIG. 11 is a diagram showing another example of the screen according to the third embodiment of the present invention.

FIG. 11 is a diagram showing another example of the screen displayed in the case where the case 125 in the assertion description of the description example 1 described above is selected. In particular, FIG. 11 shows a case where the designer is focusing attention on the part 210 in the waveform displaying section 101 that indicates that the value of the signal b is "0" in the cycle T2.

A partial expression, which is a part of the assertion, corresponding to the waveform part highlighted by the circle 210 on which the designer is focusing attention is highlighted by the solid line circle 213.

Furthermore, in the structure displaying section 102, a parent node of the node highlighted by the solid line circle 213 is highlighted by an alternate long and short dash line circle 312. Although the node highlighted by the circle 213 has no child node in the present example, if the node highlighted by the circle 213 has a child node, the child node is highlighted by a dotted line circle.

As in the correlation displaying section 103 shown in FIG. 8, three types of band symbols are used in the correlation displaying section 103, and the band part 105 corresponding to the waveform part indicated by the circle 210 on which the designer is focusing attention is highlighted by the solid line circle 212. Furthermore, in the correlation displaying section 103, the parent node 104 of the node highlighted by the solid line circle 212 is highlighted by an alternate long and short dash line circle 311. Although the node highlighted by the circle 212 has no child node in the present example, if the node highlighted by the circle 212 has a child node, the child node is highlighted by a dotted line circle.

As described above, in the case shown in FIG. 11, when a part of a waveform is specified, a part of the correlation having a parent-child relationship with a part of the correlation corresponding to the specified part of the correlation and a partial expression having a parent-child relationship with a partial expression corresponding to the specified part of the waveform are displayed in a distinguishable manner.

As described above, according to the present embodiment, since the designer can shift the focus of attention in the assertion structure by successively clicking parent and child nodes with a mouse, for example, it is easy to recognize which part of a signal, or which period in a waveform, corresponds to which part of the assertion.

The highlight function or distinguishable display function described above can be provided using the assertion structure data AS, the waveform data WV and the correlation data CR according to the second embodiment described with reference to FIG. 9. In the assertion structure data AS and the correlation data CR, a child node of a node specified by the designer as a target of highlighting can be determined by tracing the link from the specified node to the child node, and a parent node of the node specified by the designer as a target of highlighting can be determined by searching for a node that has the specified node as a child node.

As described above, when a part of the correlation or a part of the waveform is specified, the design analyzing device according to the present embodiment displays a part of the correlation and a partial expression having a parent-child relationship with the specified part of the correlation in a distinguishable manner. Therefore, in addition to the advantages of the first embodiment, the design analyzing device according to the present embodiment has an advantage that parent and child nodes in the structure displaying section and parent and child nodes in the correlation displaying section for each pass pattern of the assertion description can be displayed in a distinguishable manner for the designer. Therefore, the designer can more easily understand the meaning of the assertion and modify the assertion.

Fourth Embodiment

A design analyzing device according to a fourth embodiment differs from the design analyzing devices according to the first to third embodiments in that in the case where there are a plurality of cases where one assertion passes, waveforms to be displayed can be grouped by similarity.

The configuration of the design analyzing device according to the fourth embodiment is the same as the configuration of the design analyzing devices according to the first to third embodiments.

The number of waveforms for which an assertion passes is not always one, and there can be a plurality of, or a large number of, waveforms for which an assertion passes. In such a case, it is hard to check all the cases by using the design analyzing devices according to the first to third embodiments to analyze and display the waveforms and the assertion structures for which an input assertion passes. To solve the problem, according to the present embodiment, a large number of cases are grouped by similarity of waveform.

Figure 12:
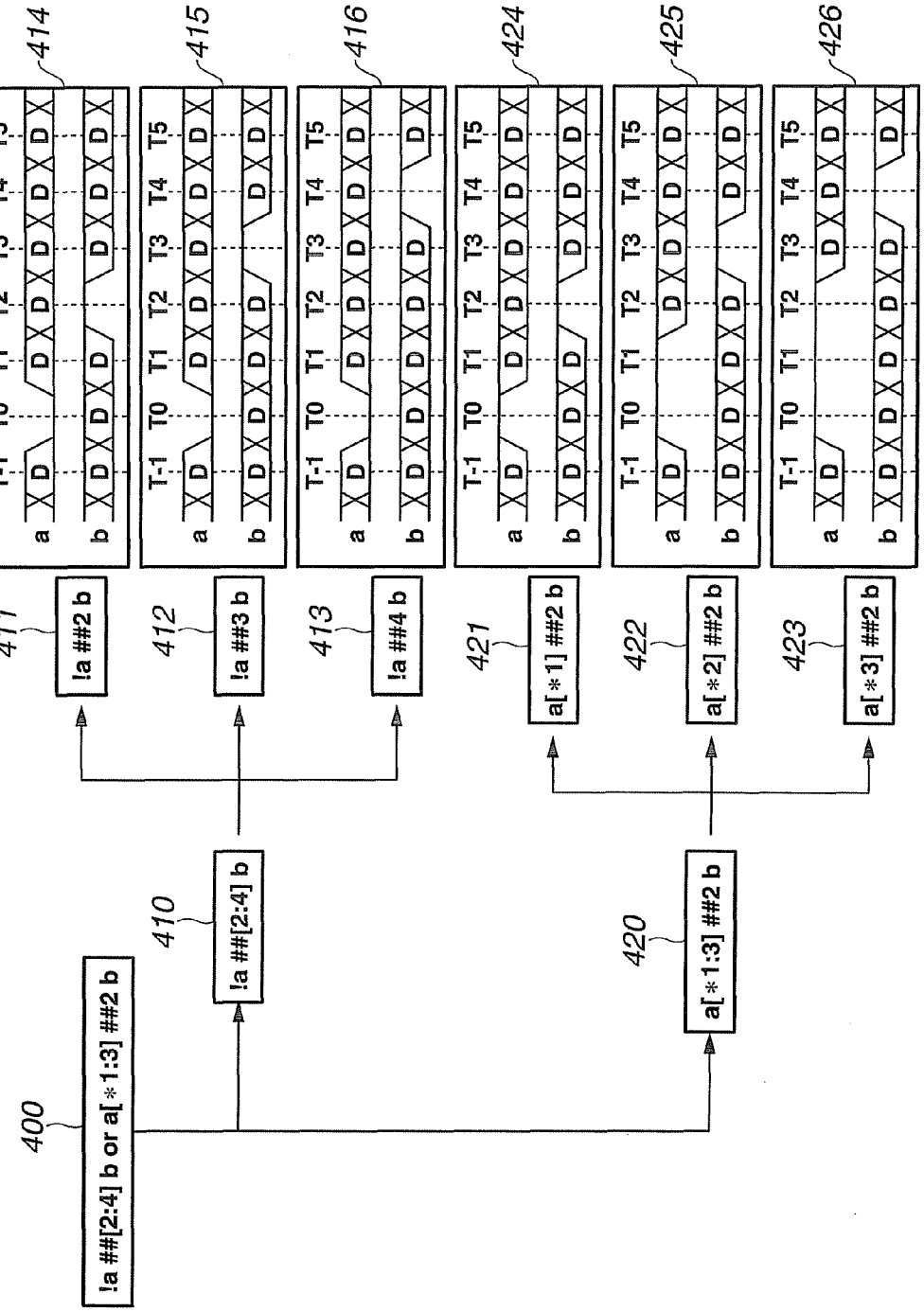
FIG. 12 is a diagram illustrating grouping according to a fourth embodiment of the present invention.

FIG. 12 is a diagram illustrating grouping of a large number of cases. FIG. 12 shows grouping in the case where an assertion of a description example 2 is input.

!a##[2:4]b or a[1:3]##2b . . . (description example 2)

The assertion description of the description example 2 means that the whole is divided by "or" representing the OR operation, and there can be a case where the left-hand side passes and a case where the right-hand side passes.

When an assertion description 400 is input, sorting into a case 410 where the left-hand side of the OR operation passes and a case 420 where the right-hand side passes is performed. The waveform significantly differs between the case where the right-hand side passes and the case where the left-hand side passes, so that the case where the right-hand side passes and the case where the left-hand side passes belong to different groups.

The case 410 is further grouped into a case 411 where the delay is 2, a case 412 where the delay is 3 and a case 413 where the delay is 4. The three cases belong to the same group because the waveform does not significantly differ between the cases, although the delay time between the cycle in which the value of the signal a is "0" and the cycle in which the value of the signal b is "1" differs.

Similarly, the case 420 is further grouped into a case 421 where the repeat count is 1, a case 422 where the repeat count is 2, and a case 423 where the repeat count is 3. The three cases belong to the same group because the waveform does not significantly differ between the cases, although the duration of the cycle in which the value of the signal a is "1" differs.

The cases 414 to 426 cannot be further sorted into different groups. Thus, a waveform and a correlation with the assertion are determined for each of the cases. In FIG. 12, waveform data 414, 415, 416, 424, 425 and 426 are shown as waveform data that meet the cases 411, 412, 413, 421, 422 and 423. The waveform data 414, 415 and 416 belong to the first case, and the cases 424, 425 and 426 belongs to the second group.

Data about a plurality of pass patterns created by the pass pattern creating section 23 is grouped into the case where the left-hand side passes and the case where the right-hand side passes based on a predetermined condition.

According to the present embodiment, the designer can check the meaning of the assertion simply by checking several waveforms belonging to the different groups. That is, since the waveforms are grouped by similarity of shape, the designer can check the meaning of the assertion simply by checking several waveforms belonging to the different groups.

Figure 13:
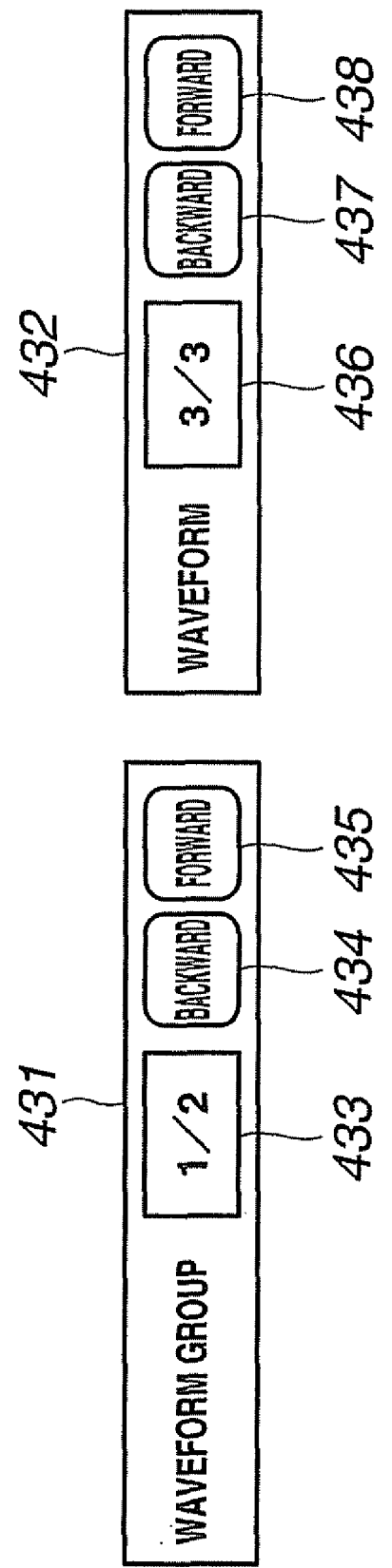
FIG. 13 is a diagram showing an example of a waveform selecting section configured to select from among grouped cases according to the fourth embodiment of the present invention.

FIG. 13 is a diagram showing an example of a waveform selecting section configured to allow selection from among the cases resulting from grouping.

A waveform selecting section 432 shown in FIG. 13 has the same configuration as the waveform selecting section 42 shown in FIG. 5 and includes a waveform number displaying section 436, a backward button 437 and a forward button 438. In addition to the waveform selecting section 432, a waveform group selecting section 431 is displayed.

The waveform group selecting section 431 includes a waveform group number displaying section 433, a backward button 434 and a forward button 435. In FIG. 13, "1/2" is displayed in the waveform group number displaying section 433. This means that three are two groups in total, and the first group is selected. This means that the case 410 is selected in the example shown in FIG. 12. The user can change the group displayed by clicking the backward button 434 or the forward button 435.

In FIG. 13, "1/2" is displayed in the waveform group number displaying section 433, and "3/3" is displayed in the waveform number displaying section 436. This means that the third waveform in the first group is selected. This means that the waveform 416 in the case 410 is selected in the example shown in FIG. 12. The user can select a waveform to be displayed in the group by clicking the backward button 437 or the forward button 438. Although extremely simplified examples of the waveform group selecting section 431 and the waveform selecting section 432 are shown herein, various methods including using a slider or other component other than the button, using a keyboard to input a waveform number, and selecting from a list can be used.

In other words, the waveform group selecting section 431 and the waveform selecting section 432 form a waveform selecting section. The waveform group selecting section 431 forms a group selecting section configured to allow selection of a group so that the diagram showing correlations is displayed on the screen for the selected group.

As described above, the design analyzing device according to the present embodiment groups waveforms to be displayed by similarity under a predetermined condition when there are a plurality of cases where an assertion passes. Since a large number of cases are grouped by similarity of waveform, all the cases can be more easily checked. Even in the case where there are a vast number of cases, the cases can be easily checked. The predetermined condition can be set by the user.

According to the embodiments described above, the assertion structure, the waveform for which the assertion description passes, and the correlation between each part of the assertion structure and each part of the waveform are displayed at the same time. Therefore, the designer can easily recognize to which part of the signal waveform each partial expression in the circuit specification description corresponds and modify the circuit specification description. That is, the designer can easily recognize whether the assertion description is as designed by the designer, and thus, failures due to a simple error in creation of the description or to disagreement in interpretation among designers caused by ambiguity of the specification description can be avoided.

In the embodiments described above, a circle is used to distinguish a part from the other parts in the display. However, a part can be distinguished from the other parts in various ways, such as displaying the part with a different color and blinking the part.

Furthermore, in the embodiments described above, relationships between the partial expressions that pass and the value of the signals, HIGH or LOW, are shown. However, there can be a case where a condition specifies the range of a value. For example, there can be a case where whether a condition passes or not is determined by whether a value falls within a preset range or not.

Figure 14:
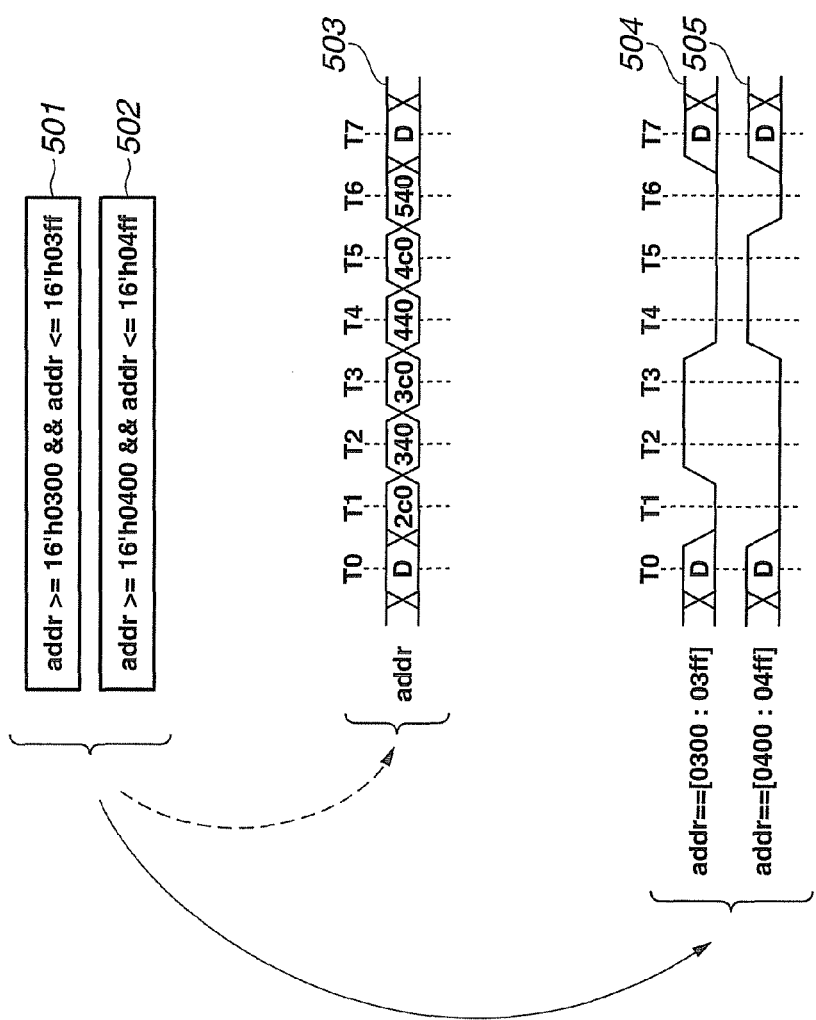
FIG. 14 is a diagram illustrating an example of a waveform displayed in the case where a condition depends on the range of a value.

FIG. 14 is a diagram illustrating an example of a waveform displayed in the case where a condition specifies the range of a value.

In assertion, in some cases, whether the value of a signal falls within a range or not is more important than the value of the signal itself. For example, the value of a multi-bit address can indicate a plurality of addresses. In some cases, whether a condition passes or not is determined based on whether the value of such an address falls within a range or not.

For example, consider a case where an assertion includes assertion descriptions 501 and 502 shown in FIG. 14. In this case, the specific value of a multi-bit signal addr is not important, but whether or not the value of a multi-bit signal addr falls within ranges from 300 to 3ff and from 400 to 4ff in hexadecimal notation is important.

In this case, a waveform diagram 503 showing specific values can be displayed as indicated by the dotted line. However, the address is variable, and it is hard for the designer to check all the waveforms in the waveform diagram 503 showing all possible address values. Rather, whether the address falls within a predetermined range or not is important.

Thus, as shown by the solid line in FIG. 14, waveform diagrams 504 and 505 showing a time-series variation of the address value to indicate whether the address value falls within a range or not. The waveform diagram 504 shows a time-series variation of the multi-bit signal addr to indicate whether the value of the multi-bit signal addr falls within a range from 300 to 3ff or not. The waveform diagram 505 shows a time-series variation of the multi-bit signal addr to indicate whether the value of the multi-bit signal addr falls within a range from 400 to 4ff or not.

Displaying the waveform diagrams 504 and 505 shown in FIG. 14 enables the designer to check whether the value of the signal falls within a range or not, which is essentially to be checked in assertion, in the form of a waveform diagram, rather than the signal value itself. Therefore, the designer can more easily recognize the correlation between the waveform and the assertion.

In the case shown described above and shown in FIG. 14, whether the value of the signal falls within a range or not is important. However, the same holds true for a case where whether there is a certain relationship between signals or not. For example, in the case where an assertion description includes a partial description that "a+100=b", the focus of attention of the designer is whether the value of b is exactly 100 greater than the value of a or not, not the specific values of a and b.

Thus, in such a case, instead of the waveform diagram for a and b, a waveform diagram that assumes HIGH when the description "a+100=b" passes and assumes LOW when the description does not pass can be displayed.

Furthermore, in the second and third embodiments, the selected parts can be not only highlighted but also provided with a comment.

FIG. 15 is a diagram showing an example of a comment displayed with the highlighted selected parts. The comment shown in FIG. 15 can be displayed on the screen in the form of a pop-up menu, for example. For example, when the band part 104 shown in FIG. 7 is clicked with a mouse, the corresponding waveform part and partial expression are highlighted, and a comment displaying window 501 is displayed. As shown in FIG. 15, a general description and a description by example for the function are displayed.

To provide such a display, a comment template 501t shown in FIG. 16 is prepared for each function or the like. The comment shown in FIG. 15 can be displayed by substituting the values concerning the part selected by the user into the template.

FIG. 16 is a diagram illustrating a comment template for the function "$rose" shown in FIG. 15. Values from the correlation data are substituted into the parts indicated by symbols ★ in FIG. 16. When the band part 104 shown in FIG. 7 is clicked with a mouse, it is determined from the node 137 shown in FIG. 9 that a comment for the function "$rose" is used. Then, for the parts "★1", "★2" and "★3" in the template 501t, it is determined from the node 138 in FIG. 9 that "b" is substituted into the part "★1", it is determined from the node 226 that "T2" is substituted into the part "★2", and it is determined from the node 227 that "T3" is substituted into the part "★3".

If the comment is additionally displayed in the second and third embodiments, the user can check the meaning and content of the function and therefore can more smoothly modify the assertion.

The term "section" used in the present specification is a conceptual entity corresponding to a function in each embodiment and therefore is not always in a one-to-one correspondence with a particular piece of hardware or a particular software routine. Therefore, in the present specification, embodiments have been described by assuming virtual circuit blocks (sections) that serve functions in the embodiments. Furthermore, for the steps in each processing in the embodiments, the order of execution of the steps can be changed, a plurality of steps can be executed at the same time, or the steps can be executed in a different order each time the processing is performed, unless it is intrinsically impossible.

The whole or a part of the program code of the program that executes the operations described above is a computer program product recorded or stored in a storage medium, such as a portable medium like a flexible disk and a CD-ROM, and a hard disk drive. A computer reads the program to execute the whole or part of the operations. Alternatively, the whole or a part of the program code of the program can be distributed or provided through a communication network. The user can easily implement the circuit specification description visualizing device according to the present invention by downloading the program from the communication network and installing the program in the computer or installing the program in the computer from the recording medium.

The present invention is not limited to the embodiments described above, and various modifications and alterations can be made without modifying the spirit of the present invention.

What is claimed is:

1. A circuit specification description visualizing device, comprising:
a circuit specification description analyzing section configured to analyze a syntax of a circuit specification description to create structure data about a partial expression included in the circuit specification description;
a pass pattern creating section configured to create data about a plurality of pass patterns for which the circuit specification description passes from the structure data created by the circuit specification description analyzing section;
a waveform data creating section configured to create waveform data about a waveform of at least one signal in a circuit defined by the circuit specification description based on data about each of the plurality of pass patterns created by the pass pattern creating section;
a correlation data creating section configured to create correlation data that indicates a correlation between the waveform of the at least one signal and the partial expression included in the circuit specification description based on the data about each of the plurality of pass patterns; and
a display data outputting section configured to output display data so as to show the correlation between the partial expression included in the circuit specification description and the waveform of the at least one signal for each of the plurality of pass patterns based on the structure data, the waveform data and the correlation data, the display data being outputted for displaying a waveform display section including a waveform diagram showing the waveform of the at least one signal, a structure display section showing the partial expression, an a correlation display section showing the correlation between each part of the waveform displayed in the waveform diagram and the partial expression displayed in the structure display section based on the correlation data, on a display device having a display screen.

2. The circuit specification description visualizing device according to claim 1, wherein the structure data is parse tree data.

3. The circuit specification description visualizing device according to claim 1, wherein the waveform diagram shows the waveform of the at least one signal at a plurality of times.

4. The circuit specification description visualizing device according to claim 3, wherein one piece of the waveform data is created for each of the plurality of pass patterns, and the display data outputting section creates the waveform diagram based on the created one piece of the waveform data.

5. The circuit specification description visualizing device according to claim 3, wherein, when a part of the correlation or a part of the waveform is specified, the display data outputting section displays a part of the waveform and a partial expression corresponding to the specified part of the correlation or a part of the correlation and a partial expression corresponding to the specified part of the waveform in a distinguishable manner.

6. The circuit specification description visualizing device according to claim 5, wherein one piece of the waveform data is created for each part of the correlation, and the display data outputting section creates the waveform diagram based on a plurality of pieces of the waveform data created.

7. The circuit specification description visualizing device according to claim 3, wherein, when a part of the correlation or a part of the waveform is specified, the display data outputting section displays a part of the correlation and a partial expression having a parent-child relationship with the specified part of the correlation in a distinguishable manner.

8. The circuit specification description visualizing device according to claim 7, wherein one piece of the waveform data is created for each part of the correlation, and the display data outputting section creates the waveform diagram based on a plurality of pieces of the waveform data created.

9. The circuit specification description visualizing device according to claim 1, wherein data about each of the plurality of pass patterns created by the pass pattern creating section are grouped based on a predetermined condition.

10. The circuit specification description visualizing device according to claim 9, further comprising:
a group selecting section configured to select a group so that a diagram showing the correlation for the group is displayed on the display screen.

11. The circuit specification description visualizing device according to claim 10, further comprising:
a pattern selecting section configured to select a pass pattern in each group so that the diagram showing the correlation for the pass pattern is displayed on the display screen.

12. A circuit specification description visualizing method realized by a computer including a circuit specification description analyzing section, a pass pattern creating section, a waveform data creating section, a correlation data creating section and a display data outputting section, the method comprising:
analyzing, by the circuit specification description analyzing section, a syntax of a circuit specification description to create structure data about a partial expression included in the circuit specification description;
creating, by the pass pattern creating section, data about a plurality of pass patterns for which the circuit specification description passes from the created structure data;
creating, by the waveform data creating section, waveform data about a waveform of at least one signal in a circuit defined by the circuit specification description based on data about each of the plurality of pass patterns created;
creating, by the correlation data creating section, correlation data that indicates a correlation between the waveform of the at least one signal and the partial expression included in the circuit specification description based on the data about each of the plurality of pass patterns; and
outputting, by the display data outputting section, display data so as to show the correlation between the partial expression included in the circuit specification description and the waveform of the at least one signal for each of the plurality of pass patterns based on the structure data, the waveform data and the correlation data, the display data being outputted for displaying a waveform display section including a waveform diagram showing the waveform of the at least one signal, a structure display section showing the partial expression, and a correlation display section showing the correlation between each part of the waveform displayed in the waveform diagram and the partial expression displayed in the structure display section based on the correlation data, on a display device having a display screen.

13. The circuit specification description visualizing method according to claim 12, wherein the structure data is parse tree data.

14. The circuit specification description visualizing method according to claim 12, wherein the waveform diagram shows the waveform of the at least one signal at a plurality of times.

15. The circuit specification description visualizing method according to claim 14, wherein one piece of the waveform data is created for each of the plurality of pass patterns, and the waveform diagram is created based on the created one piece of the waveform data.

16. The circuit specification description visualizing method according to claim 14, wherein when a part of the correlation or a part of the waveform is specified, a part of the waveform and a partial expression corresponding to the specified part of the correlation or a part of the correlation and a partial expression corresponding to the specified part of the waveform are displayed in a distinguishable manner.

17. The circuit specification description visualizing method according to claim 16, wherein one piece of the waveform data is created for each part of the correlation, and the waveform diagram is created based on a plurality of pieces of the waveform data created.

18. The circuit specification description visualizing method according to claim 14, wherein, when a part of the correlation or a part of the waveform is specified, a part of the correlation and a partial expression having a parent-child relationship with the specified part of the correlation are displayed in a distinguishable manner.

19. The circuit specification description visualizing method according to claim 12, wherein data of each of the plurality of pass patterns created are grouped based on a predetermined condition.

20. A non-transitory computer-readable storage medium that stores a program configured to visualize a circuit specification description, comprising:
a first code section configured to analyze a syntax of a circuit specification description to create structure data about a partial expression included in the circuit specification description;
a second code section configured to create data about a plurality of pass patterns for which the circuit specification description passes from the created structure data;
a third code section configured to create waveform data about a waveform of at least one signal in a circuit defined by the circuit specification description based on data about each of the plurality of pass patterns created;
a fourth code section configured to create correlation data that indicates a correlation between the waveform of the at least one signal and the partial expression included in the circuit specification description based on the data about each of the plurality of pass patterns; and
a fifth code section configured to output display data so as to show the correlation between the partial expression included in the circuit specification description and the waveform of the at least one signal for each of the plurality of pass patterns based on the structure data, the waveform data and the correlation data, the display data being outputted for displaying a waveform display section including a waveform diagram showing the waveform of the at least one signal, a structure display section showing the partial expression, an a correlation display section showing the correlation between each part of the waveform displayed in the waveform diagram and the partial expression displayed in the structure display section based on the correlation data, on a display device having a display screen.

* * * * *